US012218031B2

(12) United States Patent
Osenbach et al.

(10) Patent No.: US 12,218,031 B2
(45) Date of Patent: Feb. 4, 2025

(54) THERMAL INTERFACE MATERIAL CONTAINMENT

(71) Applicant: Infinera Corp., Sunnyvale, CA (US)

(72) Inventors: John W. Osenbach, Kutztown, PA (US); Gannon Reichert, Bethlehem, PA (US); Vinh Nguyen, Orefield, PA (US)

(73) Assignee: Infinera Corporation, San Jose, CA (US)

( * ) Notice: Subject to any disclaimer, the term of this patent is extended or adjusted under 35 U.S.C. 154(b) by 305 days.

(21) Appl. No.: 17/568,535

(22) Filed: Jan. 4, 2022

(65) Prior Publication Data

US 2022/0216127 A1 Jul. 7, 2022

Related U.S. Application Data

(60) Provisional application No. 63/133,776, filed on Jan. 4, 2021.

(51) Int. Cl.
| | |
|---|---|
| *H01L 23/433* | (2006.01) |
| *H01L 21/50* | (2006.01) |
| *H01L 23/00* | (2006.01) |
| *H01L 23/367* | (2006.01) |
| *H01L 23/373* | (2006.01) |

(52) U.S. Cl.
CPC .......... *H01L 23/433* (2013.01); *H01L 21/50* (2013.01); *H01L 23/3672* (2013.01); *H01L 23/3733* (2013.01); *H01L 23/562* (2013.01)

(58) Field of Classification Search
CPC ..................................... H01L 23/433
USPC ........................................ 257/713
See application file for complete search history.

(56) References Cited

U.S. PATENT DOCUMENTS

| | | | |
|---|---|---|---|
| 2009/0057865 A1* | 3/2009 | Brodsky | H01L 23/5385 257/E23.14 |
| 2021/0235596 A1* | 7/2021 | Uppal | H01L 23/42 |

* cited by examiner

*Primary Examiner* — Ajay Arora

(57) ABSTRACT

Systems and methods of providing a bare circuit integrated circuit package with a containment ring are described. The bare circuit integrated circuit package may be provided with a substrate connected to a printed circuit board. An integrated circuit may be connected to the substrate. A stiffener ring that surrounds the integrated circuit may be attached to the substrate. A heat sink may be positioned on the stiffener ring and over the integrated circuit such that there is a space between a top of the integrated circuit and a bottom surface of the heat sink. A thermal interface material may be provided to thermally connect the integrated circuit and the heat sink. A containment ring may be positioned between the stiffener ring and the integrated circuit, the containment ring sized and positioned to prevent pumping and/or displacement of the thermal interface material.

19 Claims, 12 Drawing Sheets

THERMAL INTERFACE MATERIAL CONTAINMENT

INCORPORATION BY REFERENCE

The entirety of the following patents and patent applications are hereby expressly incorporated herein by reference: U.S. Provisional Patent Application No. 63/133,776 filed Jan. 4, 2021.

FIELD OF THE DISCLOSURE

The disclosure generally relates to methods and apparatuses that enhance containment of a thermal interface material in a bare circuit integrated circuit package. More particularly the disclosure relates to the bare circuit integrated circuit package having a containment ring between a stiffener ring and an integrated circuit in the bare circuit integrated circuit package to reduce pumping and/or displacement of the thermal interface material in the bare circuit integrated circuit package due to forces such as mechanical shock, vibration, temperature cycling, power cycling, or drop. Though the methodologies set forth herein are in the context of bare circuit integrated circuit packages, such methodologies may be applied to any circuit packages that include a thermal interface material that may be subject to the forces discussed herein.

BACKGROUND

Many current integrated circuit packages include a multi-layer substrate upon which an integrated circuit and stiffener ring are mounted. Such integrated circuit packages may contain a lid or not. Lidless, bare die, packages are often used for improved thermal performance. Either of these package types may further include a heat sink which interfaces with the lid when the lid is present. In such packages, thermal interface material is used to facilitate thermal exchange between the integrated circuit and the lid and between the lid and the heat sink.

Handling induced shock, vibration, drop, etc. can cause motion of the heat sink with respect to the lid or integrated circuit. In such instances, the thermal interface material between the lid and the heat sink can be susceptible to large deformation/extrusion when exposed to such external stimuli. Fortunately, for lidded integrated circuit packages, the lid area is significantly larger than the integrated circuit. Further it is relatively flat. As such, thermal degradation due to external stimuli is typically not seen.

Bare circuit integrated circuit packages are integrated circuit packages without a lid where the integrated circuit interfaces directly with the heat sink. In these bare circuit integrated circuit packages, there can be significant bow in the integrated circuit and substrate. This bow, plus the relatively small area of the integrated circuit can lead to significant movement of a thermal interface material between the integrated circuit and the heat sink when these bare circuit integrated circuit packages are subjected to external stimuli.

This motion can lead to extrusion (pumping) of the thermal interface material. The loss of thermal interface material can lead to an increase in the thermal resistance across the joint between the integrated circuit and the heat sink and cause device failure as manufactured or in field use. This can be a significant failure mode for thermal interface material within the industry, especially with package devices in which the integrated circuit is directly connected to system heat sink via a single thermal interface material.

In addition to handling induced heat sink motion, power cycling and thermal cycling can cause motion of the heat sink with respect to an active device or packaged device. As is the case for handling induced motion, exposed integrated circuit packages are more receptable to these affects than lidded packages.

To solve the problem, the industry has attempted to replace thermal grease, which tends to be a viscous, liquid like material that can be easily displaced by the motion of the heat sink, with thermal phase change materials that are solid polymer-based materials with a typical softening point (phase change temperature) between 30° C. and 85° C. When below the softening point, the thermal phase change material tends to act like a pliable, low-modulus solid. Above the softening point, the thermal phase change material behaves as a semi liquid, flowing readily, but not as readily as grease. The higher softening point materials are typically employed for devices that are frequently power cycled to minimize pumping but do not always work. Unfortunately, handling induced motion is often not solved by such materials.

SUMMARY

Methods and systems are disclosed that solve the problem of pumping and/or displacement of a thermal interface material in a bare circuit integrated circuit package due to forces such as mechanical shock, vibration, temperature cycling, power cycling, or drop through placement of a containment ring between a stiffener ring and an integrated circuit in the bare circuit integrated circuit package that resists displacement of and/or pushes the thermal interface material back into place.

Consistent with one aspect of the present disclosure, a bare circuit integrated circuit package may be provided comprising a substrate connected to a printed circuit board with an integrated circuit connected to the substrate, the integrated circuit having a top. A stiffener ring may be attached to the substrate, the stiffener ring surrounding the integrated circuit. A heat sink may be provided having a bottom surface that is positioned on the stiffener ring and over the integrated circuit such that there is a space between the top of the integrated circuit and the bottom surface of the heat sink, the heat sink connected to the printed circuit board. A thermal interface material may be provided, the thermal interface material having an uncompressed volume and a compressed volume, the compressed volume being a volume of the thermal interface material compressed in the space between the top of the integrated circuit and the bottom surface of the heat sink to thermally connect the integrated circuit and the heat sink. A containment ring having a first wall and a second wall positioned between the stiffener ring and the integrated circuit may be provided, the containment ring sized and positioned such that a gap between the first wall of the containment ring and the integrated circuit has a volume of air of between zero percent and thirty percent smaller than the compressed volume of the thermal interface material.

Consistent with one aspect of the present disclosure, a method of assembling a bare circuit integrated circuit package is disclosed, comprising connecting an integrated circuit to a substrate; connecting a stiffener ring to the substrate surrounding the integrated circuit; positioning a containment ring having a first wall and a second wall between the stiffener ring and the integrated circuit, the containment ring sized and positioned such that a gap between the first wall of the containment ring and the integrated circuit has a volume of air of between zero percent and thirty percent of a compressed volume of thermal interface material; applying the thermal interface material to a top surface of the integrated circuit, the thermal interface material having an uncompressed volume and a compressed volume, the compressed volume being a volume of the thermal interface material compressed in a space; and applying a heat sink to compress the thermal interface material and to cover the integrated circuit and the containment ring, the heat sink having a bottom surface that is positioned on the stiffener ring and over the integrated circuit.

BRIEF DESCRIPTION OF THE DRAWINGS

The accompanying drawings, which are incorporated in and constitute a part of this specification, illustrate one or more implementations described herein and, together with the description, explain these implementations. In the drawings.

DETAILED DESCRIPTION

Figure 1:
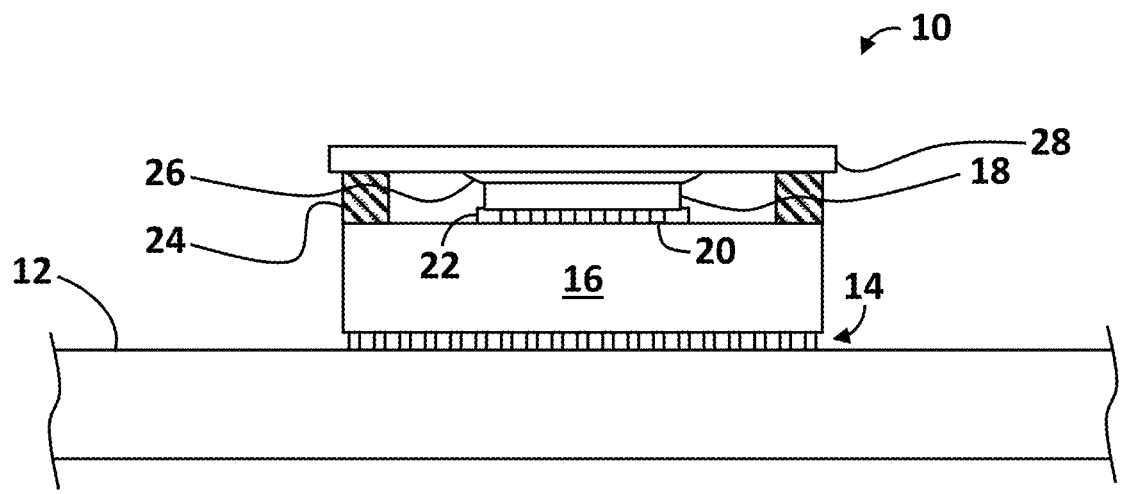
FIG. 1 is a partial sectional view of a prior art lidded integrated circuit package.

The following detailed description refers to the accompanying drawings. The same reference numbers in different drawings may identify the same or similar elements.

The mechanisms proposed in this disclosure circumvent the problems described above. The present disclosure describes systems and methods of providing a bare circuit integrated circuit package with a containment ring that prevents pumping and/or displacement of a thermal interface material. In one exemplary embodiment, a bare circuit integrated circuit package is provided comprising: a substrate connected to a printed circuit board; an integrated circuit connected to the substrate, the integrated circuit having a top; a stiffener ring attached to the substrate, the stiffener ring surrounding the integrated circuit; a heat sink having a bottom surface that is positioned on the stiffener ring and over the integrated circuit such that there is a space between the top of the integrated circuit and the bottom surface of the heat sink, the heat sink connected to the printed circuit board; a thermal interface material, the thermal interface material having an uncompressed volume and a compressed volume, the compressed volume being a volume of the thermal interface material compressed in the space between the top of the integrated circuit and the bottom surface of the heat sink to thermally connect the integrated circuit and the heat sink; and a containment ring having a first wall and a second wall positioned between the stiffener ring and the integrated circuit, the containment ring sized and positioned such that a gap between the first wall of the containment ring and the integrated circuit has a volume of air of between zero percent and thirty percent smaller than the compressed volume of the thermal interface material.

A method of assembling an exemplary bare circuit integrated circuit package is disclosed comprising: connecting an integrated circuit to a substrate; connecting a stiffener ring to the substrate surrounding the integrated circuit; positioning a containment ring having a first wall and a second wall between the stiffener ring and the integrated circuit, the containment ring sized and positioned such that a gap between the first wall of the containment ring and the integrated circuit has a volume of air of between zero percent and thirty percent of a compressed volume of thermal interface material; applying the thermal interface material to a top surface of the integrated circuit, the thermal interface material having an uncompressed volume and a compressed volume, the compressed volume being a volume of the thermal interface material compressed in a space; and applying a heat sink to compress the thermal interface material and to cover the integrated circuit and the containment ring, the heat sink having a bottom surface that is positioned on the stiffener ring and over the integrated circuit.

Definitions

If used throughout the description and the drawings, the following short terms have the following meanings unless otherwise stated:

DIE refers to a substrate of semiconducting material (e.g., silicon) onto which circuits are etched.

DSP stands for digital signal processor and refers to hardware designed to measure, filter, and/or compress analog signals into digital data. As used herein, DSP may refer to processors that are capable of processing either fixed point numeric data, or floating point data.

TIM stands for thermal interface material and is a material that transfers heat between two or more solid surfaces. Exemplary thermal interface materials may include adhesive tapes, thermal grease, potting compounds, liquid adhesives, thermal phase change materials, gap fillers, thermally conductive hardware, adhesive films, and thermal rubber pads, for instance.

DESCRIPTION

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by anyone of the following: A is true (or present) and B is false (or not present), A is false (or not present) and B is true (or present), and both A and B are true (or present).

In addition, use of the "a" or "an" are employed to describe elements and components of the embodiments herein. This description should be read to include one or more and the singular also includes the plural unless it is obvious that it is meant otherwise.

Further, use of the term "plurality" is meant to convey "more than one" unless expressly stated to the contrary.

Further, the phrase "based on" is intended to mean "based, at least in part, on" unless explicitly stated otherwise.

Finally, as used herein any reference to "one embodiment" or "an embodiment" means that a particular element, feature, structure, or characteristic described in connection with the embodiment is included in at least one embodiment. The appearances of the phrase "in one embodiment" in various places in the specification are not necessarily all referring to the same embodiment.

Referring now to the drawings, and in particular to FIG. 1, a partial sectional view of a typical flip chip (FC) stiffener (SR) lidded (L) ball grid array (BGA) package that will be referred to herein as integrated circuit package 10 is shown. The integrated circuit package 10 illustrated in FIG. 1 is shown connected to a printed circuit board (PCB) 12 via a ball grid array (BGA) 14. The integrated circuit package 10 is provided with a substrate 16, an integrated circuit 18, solder bumps 20 (only one of which is numbered in), an underfill 22, a stiffener ring 24, a thermal interface material 26, and a lid 28.

The substrate 16 may be made up of multiple alternating levels of metal and dielectric material affixed to the top and bottom of one or more cores. One conventional type of substrate 16 consists of one or more cores laminated between upper and lower build-up layers. The core itself may consist of layers of glass filled epoxy. The build-up layers, which may number two or more on opposite sides of the core, are formed from a type of resin. Various metallization structures are interspersed in the core and build-up layers in order to provide electrical pathways between pins or pads on the lowermost layer of the substrate 16 that interface with the BGA 14 and electrical interconnects on the uppermost layer of the substrate 16 that interface with the integrated circuit 18 as will be described below. Typically, a pitch (i.e., spacing between the center of one BGA ball to the center of an adjacent BGA ball) of the BGA 14 on the substrate 16 range between 250 µm and 1.25 mm, however smaller or larger pitches are also possible. The substrate 16 routing and ultimate BGA 14 pitch is typically driven by performance, and reliability.

The electrical interconnects of the upper most layer of the substrate 16 connect to the integrated circuit 18 through the solder bumps 20. After the integrated circuit 18 is seated on the substrate 16, a reflow process is performed to enable the solder bumps 20 of the integrated circuit 18 to metallurgically link to the electrical interconnects of the substrate 16. The solder bumps 20 are typically either lead free solder or copper (Cu) pillar and solder, although other material can be used for these joints such as gold (Au), indium (In), silver (Ag), anisotropic conductive adhesives, etc. Typically, the solder bumps 20 pitch (i.e., spacing between the center of one solder bump to the center of an adjacent solder bump) ranges from 40 µm to 250 µm. Smaller or larger pitch as well as other solder bumps 20 materials can be used and are well understood by those skilled in the art.

The underfill 22 is a material that is deposited between the integrated circuit 18 and the substrate 16 to prevent damage to the solder bumps 20 due to mismatches in the coefficients of thermal expansion between the integrated circuit 18 and the substrate 16 as well as acting as an adhesive to hold the integrated circuit 18 in place.

The core of the substrate 16 provides a certain stiffness to the substrate 16. Even with that provided stiffness, substrate 16 may warp due to mismatches in coefficients of thermal expansion for the integrated circuit 18, underfill 22, and substrate 16. Typically, the integrated circuit 18 is made of silicon, approximate coefficient of thermal expansion (CTE) 3 ppm/° C., and the substrate 16 is made of a combination of polymer and patterned Cu, approximate CTE range 8 ppm/° C.-15 ppm/° C. The large difference in the CTE between the integrated circuit 18 and the substrate 16 causes substantial warpage of the substrate 16 and integrated circuit 18 often making assembly of the integrated circuit 18 and the substrate 16 to the PCB 12 impossible without having open or short BGA 14 connections. To reduce overall bow, the stiffener ring 24 is attached to the substrate 16. To avoid yield issues, the stiffener ring 24 may be attached to the substrate 16 prior to attachment of the integrated circuit 18 and underfill 22. However, it should be noted that the stiffener ring 24 may be attached after the integrated circuit 18 and either before the underfill 22 or after the underfill 22. The stiffener ring 24 may be connected to the upper layer of the substrate 16 using adhesive materials such as epoxy, or solder. Other adhesives can also be used as long as they are compatible with the overall integrated circuit package 10 assembly process flow temperature hierarchy.

After the integrated circuit 18 is mounted to the substrate 16, the lid 28 may be attached to the stiffener ring 24 to cover the integrated circuit 18. Typically, the lid 28 is attached to the stiffener ring 24 using an adhesive such as epoxy. The lid 28 provides mechanical protection to the integrated circuit 18, a large flat surface to which the heat sink 32 may be connected, and improves the overall flatness of the integrated circuit package 10.

Because air is a very poor thermal conductor (i.e., thermal conductivity of air is ~0.02 W/m-K), the thermal interface material 26 between the integrated circuit 18 and lid 28 is required for thermal management of the integrated circuit 18. Before attaching the lid 28 to the stiffener ring 24, the thermal interface material 26 may be placed between a top of the integrated circuit 18 and the lid 28. Typically, the thermal interface material 26 is an epoxy which is filled with thermally conducting particles such as Ag, oxides of zinc or aluminum, boron nitride, etc. typically between 40 μm and 250 μm. The thermal conductivity of such materials is typically between 1 W/m-K and 10 W/m-K. In some high-power devices, typically >250 W, solder or metal can be used for the thermal interface material 26. Such materials have thermal conductivities between 25 W/m-K and 400 W/m-K. Both solder and epoxy base thermal interface materials are solid materials that possess mechanical properties that keep the thermal interface material 26 from being deformed in such ways as to cause a degradation in overall thermal performance when exposed to shock, vibration, temperature cycling, and power cycling.

Figure 2:
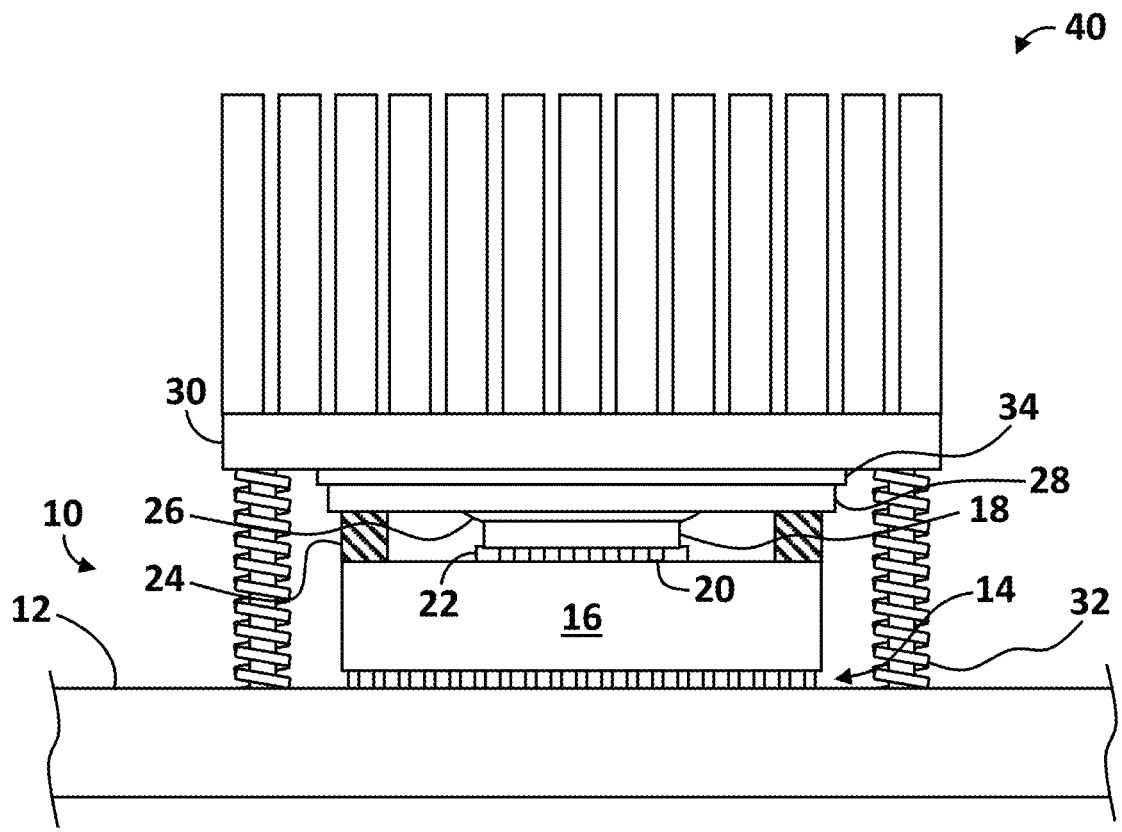
FIG. 2 is a partial sectional view of the lidded integrated circuit package of FIG. 1 with a heat sink.

Referring now to FIG. 2, shown therein is a representation of a typical final assembly of the integrated circuit package 10 of FIG. 1 attached to the PCB 12 with a heat sink 30 connected to the PCB 12 via spring mounts 32 (only one of which is numbered in FIG. 2) with a second thermal interface material 34 in between a top of the lid 28 and a bottom of the heat sink 30 to form an integrated circuit system 40. The spring mounts 32 are loaded such that the heat sink 30 is mechanically and thermally connected to the lid 20 of the integrated circuit package 10 through the second thermal interface material 34. Unlike thermal interface material 26, the second thermal interface material 34 is typically a material that possesses mechanical properties that are susceptible to large deformation or extrusion when exposed to shock, vibration, temperature cycling, and power cycling. If such deformation occurs, then the deformation degrades the thermal performance of the integrated circuit package 10.

The complexity and functionality of integrated circuits such as integrated circuit 18 continues to drive increased power density and total power. The increased power and power density makes it increasingly more difficult to cool the integrated circuits to maintain performance and reliability requirements. The increased power and power density can lead to cooling related issues with the more traditional FC-SR-L-BGA packaging technology such as the integrated circuit package 10. If the temperature of the integrated circuit 18 is not maintained below a maximum, then the performance, the reliability, or both of the integrated circuit 18, as well as any device in which the integrated circuit 18 may be installed may be compromised. In integrated circuit system 40, for instance, the integrated circuit package 10 is connected via the second thermal interface material 34 to the heat sink 30. This means there are two thermal interface material interfaces, thermal interface material 26 between the integrated circuit 18 and the lid 28 and the second thermal interface material 34 between the lid 28 and the heat sink 30.

An equation ($\Delta T = Rth*Q$) defines a temperature drop, $\Delta T$, across the integrated circuit 18 to the heat sink 30. As shown, $\Delta T$ between the integrated circuit 18 and the heat sink 30 can be determined from the thermal resistance, Rth, between the integrated circuit 18 and the heat sink 30 and the power dissipated in the integrated circuit system 40, Q.

Rth can be written as $Rth = t/kA$, where t is a thickness of the total joint between the integrated circuit 18 and the heat sink 30, k is an effective thermal conductivity of the total joint between the integrated circuit 18 and the heat sink 30, and A is an area of the integrated circuit 18.

For a design such as the integrated circuit package 10 shown in FIG. 2, the total joint between the integrated circuit 18 and the heat sink 30 includes, thermal interface material 26 (TIM1), the lid 28 (lid), and the second thermal interface material 34 (TIM2). Thus, Rth is a series combination of each or $Rth = RthTIM1 + Rthlid + RthTIM2$.

Typically, k and thicknesses for TIM1 and TIM2 are between 3-7.5 W/m-K and 25-100 μm, respectively; k and t for lid is between 150-400 W/m-K and 0.5-1 mm, respectively; Q and area per integrated circuit is between 100-300 W and 225-800 mm2 respectively for high end processors, FPGAs, etc.

Plugging in the mid-point typical values for k, t, Q, and A, for the integrated circuit system 40 shown in FIG. 2 yields a $\Delta T$ ~10.6° C. Typically the interfaces of TIM1 between the integrated circuit 18 and lid 28 and TIM2 between lid 28 and heats sink 30 add additional thermal resistance in the overall joint. It is common for such interface resistances to add an additional 1-3 $\Delta T$, for a total of ~11.6-13.6° C.

This additional $\Delta T$ must be taken care of in the overall thermal design and can often be the reason a system such as the integrated circuit system 40 cannot meet thermal requirements of the integrated circuit 18.

Figure 3:
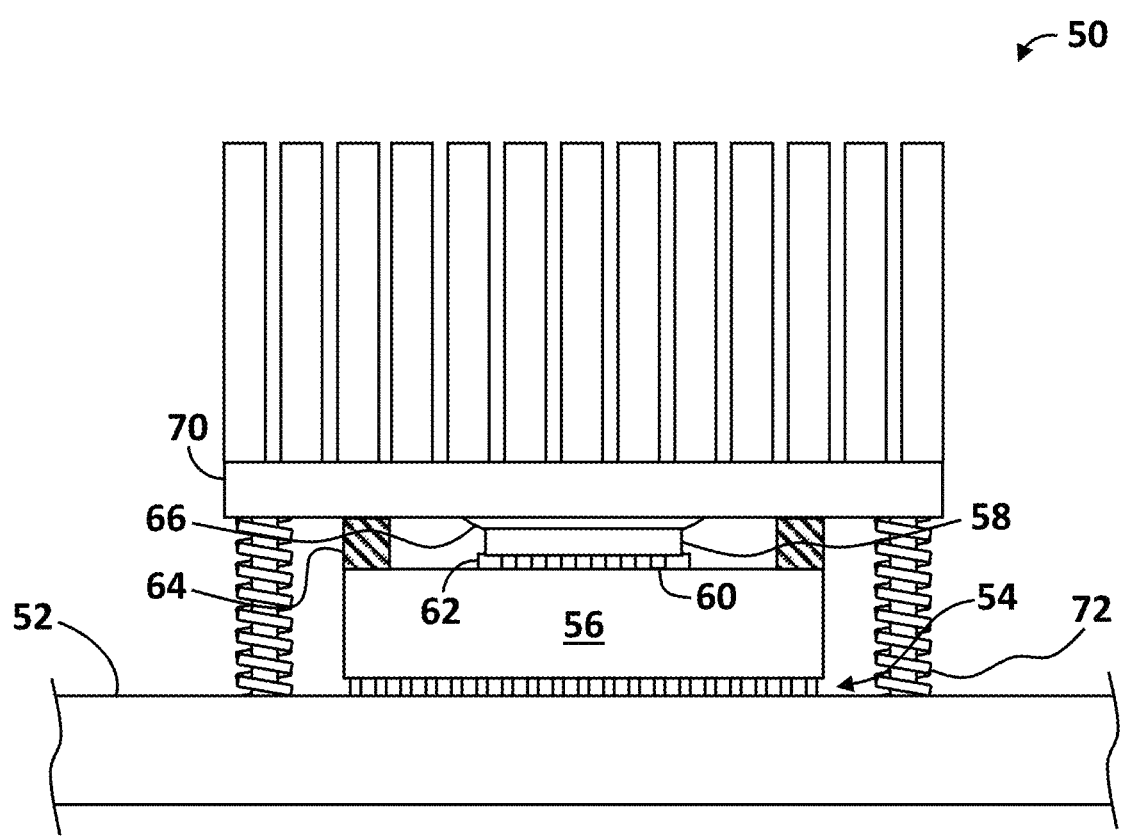
FIG. 3 is a partial sectional view of a prior art bare circuit integrated circuit package.

To reduce the thermal drop across an integrated circuit to heat sink joint such that the max integrated circuit temperature specification is met, the integrated circuit package 10 and the integrated circuit system 40 shown in FIG. 1 and FIG. 2, respectively, are modified by removing the lid 28 and the second thermal interface material 34 from the configuration as illustrated by the bare circuit integrated circuit package 50 shown in FIG. 3. This type of integrated circuit package without the lid 28 may be referred to as a bare die or exposed die package in the art.

The bare circuit integrated circuit package 50 illustrated in FIG. 3 is shown connected to a PCB 52 via a ball grid array (BGA) 54. The bare circuit integrated circuit package 50 is provided with a substrate 56, an integrated circuit 58, solder bumps 60 (only one of which is numbered), an underfill 62, a stiffener ring 64, a thermal interface material 66, and a heat sink 70 connected to the PCB 52 via spring mounts 72 (only one of which is numbered).

The bare circuit integrated circuit package 50, as compared to the integrated circuit package 10, eliminates Rth-TIM2, RthLid and the 2 interfaces, TIM2 to lid and TIM1 to lid.

Using the same mid-point typical values for k, t, Q, and A, as in FIG. 2 and applying them to that shown in FIG. 3 yields $\Delta T$ ~4.6-5.8° C. That is, the bare circuit integrated circuit package 50 has a decreased $\Delta T$ integrated circuit 58 to heat sink 70 that is <½ that for the integrated circuit package 10. Although this may not seem like a large difference in $\Delta T$, it is often the difference between having a system design that meets the integrated circuit max temp specifications and not. As such, the bare circuit integrated circuit package 50 is commonly employed for leading edge products.

However, the bare circuit integrated circuit package 50 has a significant drawback. Specifically, degradation of a thermal joint between the heat sink 70 and the integrated circuit 58 due to loss of and/or non-uniform thickness of the thermal interface material 66 caused by handling induce shock, thermal cycling, power cycling, loss of thermal gradient, and loss of thermal interface material 66 due to a stress gradient across the heat sink 70 and/or the integrated circuit 58.

Figure 4:
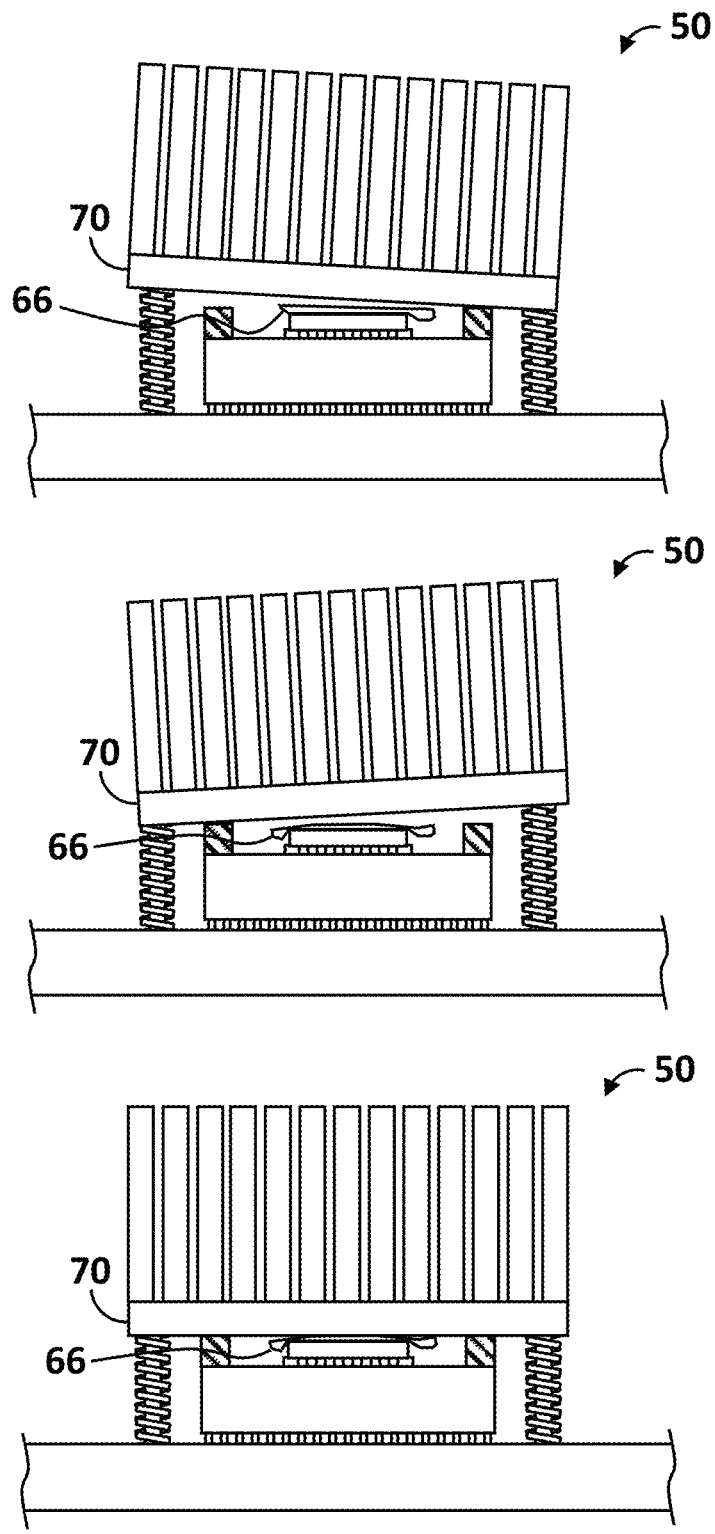
FIG. 4 is a partial sectional view of the bare circuit integrated circuit package of FIG. 3 showing pumping of a thermal interface material due to handling induced heat sink motion of the bare circuit integrated circuit package.

FIG. 4 is a schematic representation of how handling induced motion of the heat sink 70 may lead to failure of the thermal interface material 66 in the bare circuit integrated circuit package 50. A shock wave causes the heat sink 70 to rock in one direction causing the thermal interface 66 to sever, then when the heat sink 70 rocks in the opposite direction, the heat sink 70 can sever the thermal interface 66 in other locations. After the shock wave passes thought the bare circuit integrated circuit package 50, the heat sink 70 comes back to rest on the integrated circuit 56, but the thermal interface 66 contact area is reduced driving the ΔT higher, potentially leading to device failures.

Referring now to FIGS. 5A-7B, bare circuit integrated circuit packages 100 and 150 solve the problems of the bare circuit integrated circuit package 50 by including containment rings 102a and 102b (referred to herein collectively as containment ring 102) positioned in a space 104 between the stiffener ring 64 and the integrated circuit 58. The integrated circuit 58 has an outer peripheral edge 106. A geometry of the containment ring 102 is dependent on a design of the bare circuit integrated circuit packages 100 and 150 and the integrated circuit 58 design. In the example shown in FIGS. 5A-7B, the stiffener ring 64 is continuous and has an inner peripheral edge 107 spaced an equal amount from the outer peripheral edge 106 of the integrated circuit 58 to form the space 104. In accordance with the present disclosure integrated circuit 58 that can be mated any type of integrated circuit that requires external heatsinking. Exemplary types of the integrated circuit 58 can be a processor, such as a DSP, microprocessor, Field Programmable Gate Array, or Application Specific Integrated Circuit.

Design and material properties of the containment ring 102 prevents extrusion and/or movement of the thermal interface material 66 when exposed to power and/or temperature cycling, mechanical shock, vibration, drop, etc., while not negatively affecting overall performance of the design of the bare circuit integrated circuit package 100. More specifically, in some embodiments, the design and material properties of the containment ring 102 does not:
  lead to an increase in thermal interface material 66 joint thickness when compared to current technology and design;
  degrade the thermal mechanical or thermo mechanical stability properties of the thermal interface material 66 and design;
  physically or chemically interact and degrade the thermal interface material 66 or other design features of the bare circuit integrated circuit package 100; and
  the design and material properties of the containment ring 102 do not physically or chemically alter the thermal interface material 66 or other design features when exposed to temperature, humidity, or other field use ambient chemistries or chemicals.

In some embodiments, the design and material properties of the containment ring 102 does:
  prevent excessive movement/extrusion of the thermal interface material 66;
  creates a restoring force that drives any power and/or temperature cycling, mechanical shock, vibration, drop, etc., that leads to movement of the TIM from the joint is driven back into the joint thus preventing loss of contact area when device is operating;
  prevent severing of the thermal interface material 66; and
  creates a seal to heat sink 70 that provides additional strength to the overall design of the bare circuit integrated circuit package 100 to reduce probability of excessive motion of heat sink 70.

Figure 5A:
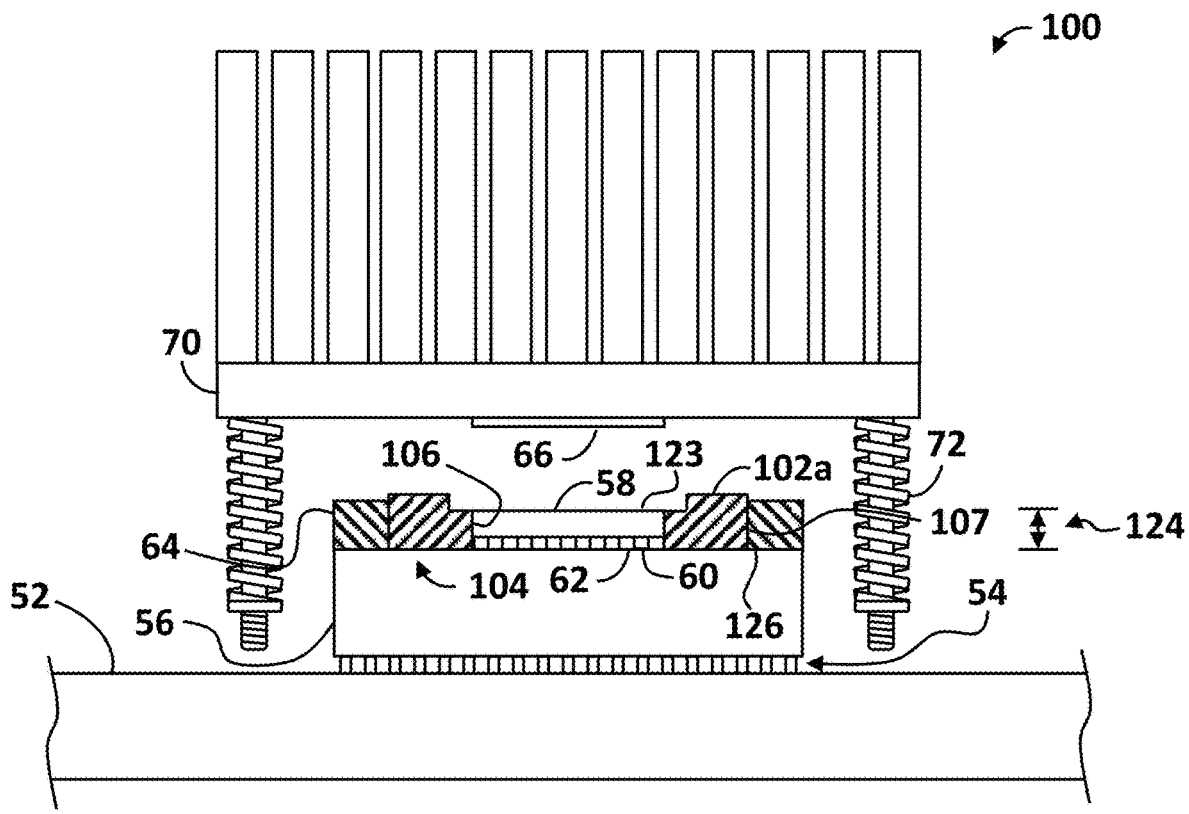
FIG. 5A is a partially exploded view of a bare circuit integrated circuit package with a stepped containment ring constructed in accordance with one embodiment of the presently disclosed inventive concepts.
Figure 5B:
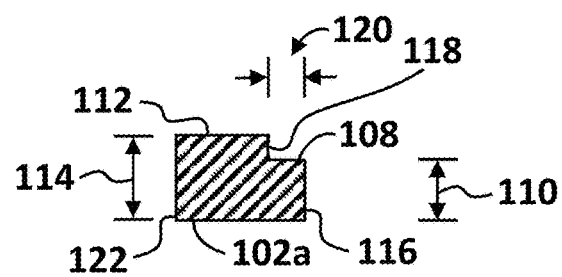
FIG. 5B is a sectional view of the stepped containment ring of FIG. 5A.
Figure 7A:
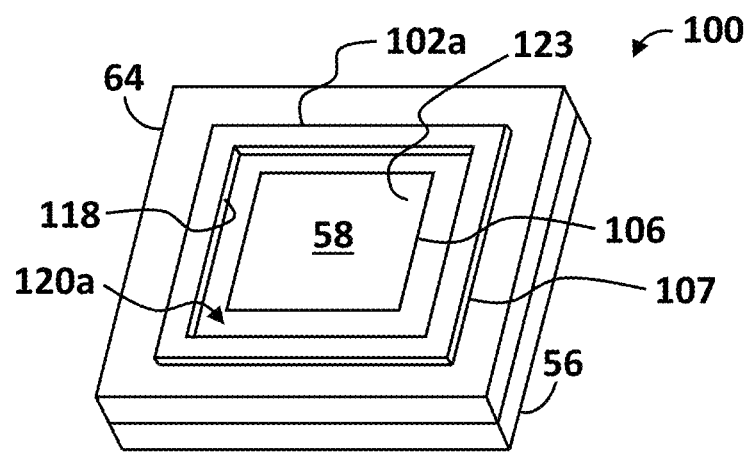
FIG. 7A is a perspective view of a stepped containment ring surrounding an integrated circuit in accordance with one embodiment of the presently disclosed inventive concepts.

In the embodiment illustrated in FIGS. 5A, 5B, and 7A, the containment ring 102a is stepped meaning that the containment ring 102a has a first step 108 having a first height 110 and a second step 112 having a second height 114 with the second height 114 greater than the first height 110. The first step 108 has a first wall 116 extending from a bottom of the containment ring 102a to the first step 108 and the second step 112 has a second wall 118 extending from the first step 108 to the second step 112. A distance between the first wall 116 and the second wall 118 forms a gap 120. The containment ring 102a may further be provided with a third wall 122 positioned opposite and parallel to the first wall 116.

The first and second steps 108 and 112 may be beneficial in the cases where a volume of displaced thermal interface material is relatively small in comparison to the final height of the integrated circuit 58. In embodiments of the bare circuit integrated circuit package 100 where the containment ring 102a is used having the first step 108 and the second step 112, the size of the gap 120 may be increased while still meeting the volume requirements discussed above making bare circuit integrated circuit package 100 easier to produce and assemble. For thermal interface materials whose viscosity or viscoelastic properties are such that the thermal interface materials easily flow during heat sink attachment or when the entire bare circuit integrated circuit package 100 is subjected to forces such as power and temp cycling, shock, vibration, drop, etc., the design of the containment ring 102a having first and second steps 108 and 112 provides protection from severing the thermal interface material 66 thus increasing the ability of the containment ring 102a to provide a restoring force to drive the interface material 66 back into the joint between the integrated circuit 58 and the heat sink 70 after being partially or completely displaced from the joint between the integrated circuit 58 and the heat sink 70. In the embodiment of FIG. 5A, the first wall 116 is positioned against the outer peripheral edge 106 of the integrated circuit 58 to form a seal and thereby prevent the interface material 66 from moving in between the first wall 116 and the outer peripheral edge 106. A top surface 123 of the integrated circuit 58 is spaced a distance 124 from a top surface 126 of the substrate 56. In some embodiments, the second height 114 is greater than the distance 124 by 100 microns to 300 microns. In one embodiment, the first step 108 may be flush with the top surface 123 of the integrated circuit 58, i.e., the first height 110 may be a range from ½ the distance 124 to the distance 124. The second height 114 can be in a range from 250 microns to 800 microns.

Figure 6:
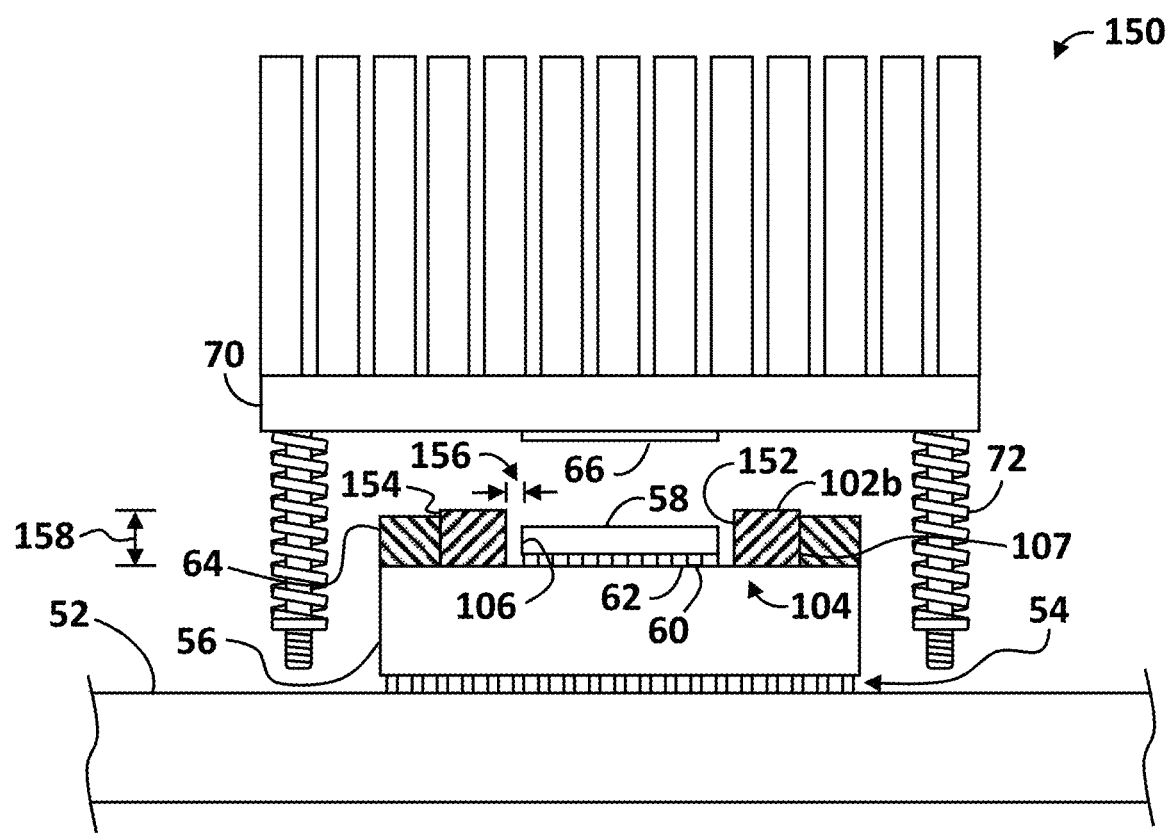
FIG. 6 is a partially exploded view of a bare circuit integrated circuit package with a non-stepped containment ring constructed in accordance with another embodiment of the presently disclosed inventive concepts.
Figure 7B:
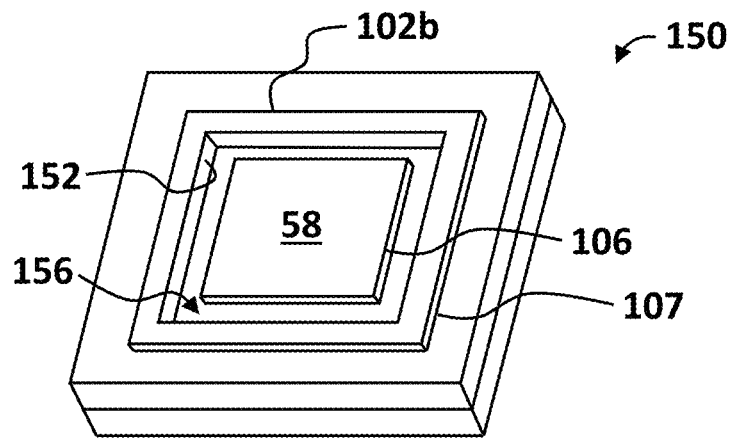
FIG. 7B is a perspective view of the non-stepped containment ring surrounding an integrated circuit in accordance with one embodiment of the presently disclosed inventive concepts.

In the embodiment illustrated in FIGS. 6 and 7B, the containment ring 102b has a non-stepped cross-sectional configuration. For example, the cross-sectional configuration of the containment ring 102b may be substantially square or rectangularly shaped depending on the shape and size of the integrated circuit 58, the stiffener ring 64, and the space 104. The containment ring 102b is provided with a first face 152, a second face 154, and has a height 158. The first face 152 and the second face 154 of the containment ring 102b are substantially parallel. A distance between the outer peripheral edge 106 of the integrated circuit 58 and the first face 152 of the containment ring 102b forms a gap 156.

The containment rings 102a and 102b may be sized and positioned within the space 104 such that the gap 156 between the outer peripheral edge 106 of the integrated circuit 58 and the first wall 116 of the containment ring 102a or the first wall 152 of the containment ring 102b, respectively, is between 0.0 mm and 1.0 mm. In a preferred embodiment, the gap between the stiffener ring 64 and the third wall 122 of the containment ring 102a or the second wall 154 of the containment ring 102b, respectively, is between 0.0 mm and 0.1 mm.

In some embodiments, a size of gap 120 and gap 156 may be sized such that a volume of air that would fill gap 120 and gap 156 is between 0% and 30% smaller than a volume of thermal interface material 66 that will be displaced when the heat sink 70 is moved, e.g., screwed down, to its design height. In a preferred embodiment, the size of the gap 120 and 156 may be sized such that the volume of air that would fill gap 120 and gap 156 is between 0% and 10% smaller than the volume of thermal interface material 66 that will be displaced when the heat sink 70 is moved down to its design height.

In some embodiments, the first height 110 is substantially equal to a height of the integrated circuit 58 (i.e., the distance 124) when the integrated circuit 58 is installed on the substrate 56. The second height 114 of the containment ring 102a and the height 158 of the containment ring 102b may be between 0.05 mm and 1 mm higher than a final height (i.e., the distance 124) of the integrated circuit 58 when the integrated circuit 58 is installed on the substrate 56 plus a thickness of the thermal interface material 66 when compressed. In a preferred embodiment, the second height 114 of the containment ring 102a and the height 158 of the containment ring 102b may be between 0.1 mm and 0.5 mm higher than the final height of the integrated circuit 58 when the integrated circuit 58 is installed on the substrate 56 plus a thickness of the thermal interface material 66 when compressed.

In some embodiments, the material of the containment ring 102 may engage and also form a bond to the heat sink 70 which provides additional strength and reduces the probability of excessive motion of the heat sink 70.

The containment ring 102 may be made of a material that is compressible and deformable so as to deform when the heat sink 70 compresses the containment ring 102 against the substrate 56 as the heat sink 70 is moved into position against the containment ring 102. The compressibility and deformability are related to a mechanical modulus and strain to failure ratio of the material forming the containment ring 102. In exemplary embodiments, the mechanical modulus may be between 1 MPa and 1 GPa. In a preferred embodiment, the mechanical modulus may be between 50 MPa and 250 MPa. In exemplary embodiments, the strain to failure ratio may be between 2% and 100%. In a preferred embodiment, the strain to failure ration may be between 20% and 60%.

Figure 8:
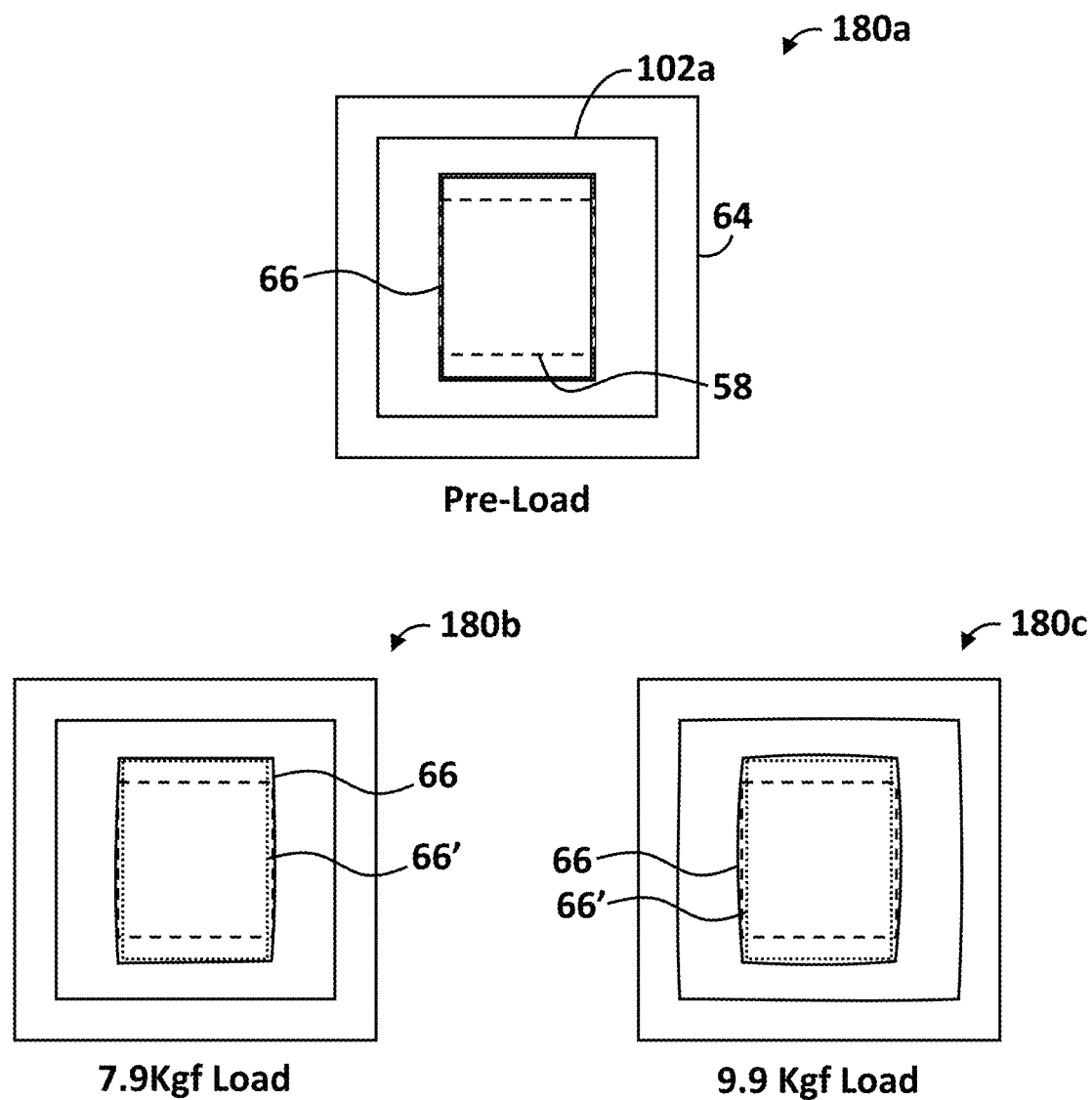
FIG. 8 is a series of top views of a bare circuit integrated circuit package with a stepped containment ring illustrating compression of the stepped containment ring and a thermal grease thermal interface material with a glass plate.
Figure 9:
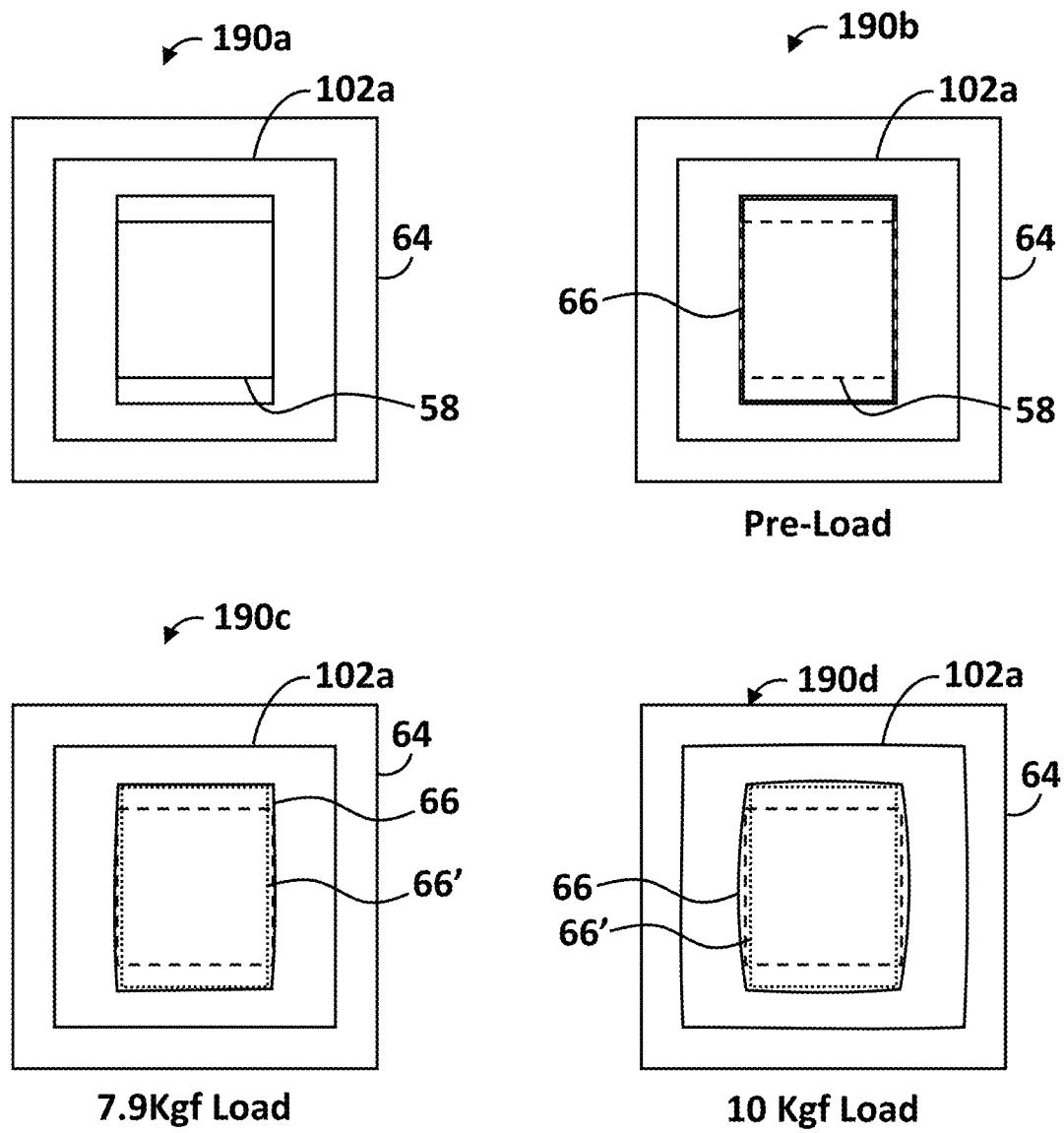
FIG. 9 is a series of top views of a bare circuit integrated circuit package with a stepped containment ring illustrating compression of the stepped containment ring and a thermal phase change material thermal interface material with a glass plate.
Figure 10:
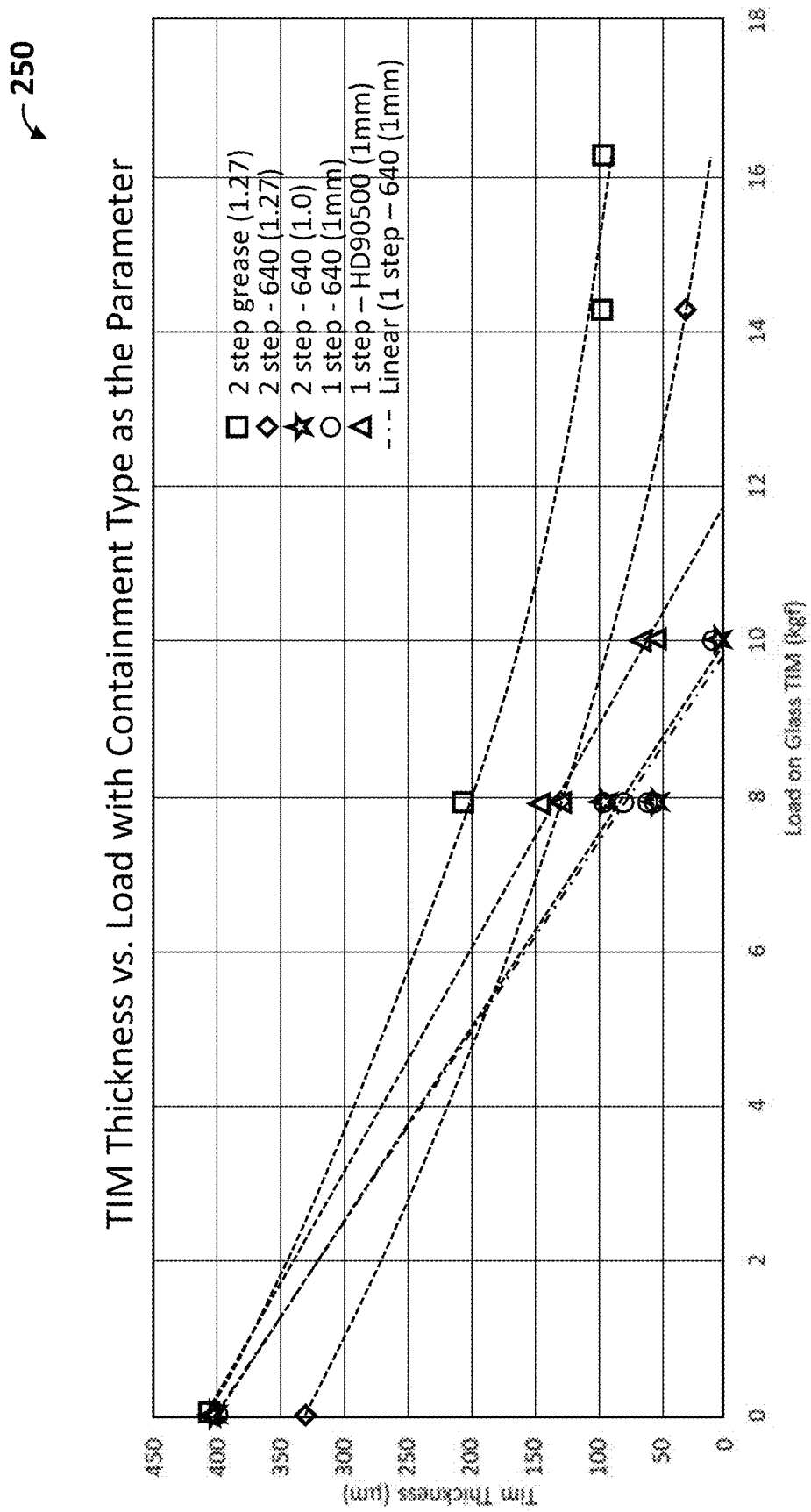
FIG. 10 is a graphical representation of a thickness of a thermal interface material relative to a top of an integrated circuit as a load is placed on the glass plate of FIGS. 8 and 9.

Referring now to FIGS. 8-10, experimentation was performed using a bare circuit integrated circuit package similar to bare circuit integrated circuit package 100 with the exception that a glass plate was used in place of the heat sink 70 so that a compression of the thermal interface material 66 could be observed. In the interest of brevity, the numbering of bare circuit integrated circuit package 100 will be used to indicate the elements of the bare circuit integrated circuit packages illustrated in FIGS. 8-10. A final height of the integrated circuit 58 installed on the substrate for testing was 900 µm, the thermal interface material 66 starting thickness was 400 µm, and an uncompressed volume of the thermal interface material 66 was 168 mm$^3$. A volume of the thermal interface material 66 when compressed between the integrated circuit 58 and the glass plate to a height of 25 µm was 26 mm$^3$. Two different containment ring 102 designs were evaluated, a single wall design (containment ring 102b) and a stepped design (containment ring 102a). When the containment ring 102a was used, the outer wall 122 was within 0.1 mm of the stiffener ring 64. In both embodiments, the gap 120 and 156 between the containment ring 102a and 102b and the integrated circuit 58 was such that the total air volume was ~90+/−5% of the displaced volume of the thermal interface material 66 when compressed to 25 µm, 142 mm$^3$+/−5% (0.9*(168 mm$^3$−26 mm$^3$). Two different containment ring 102 thicknesses (1.27 mm and 1 mm), and two different materials (Laird Tflex640 and Tflex90000 thermal pad materials) were evaluated. Tflex 640 has a lower modulus than Tflex 9000, thus Tflex 9000 is more resistant to deformation than Tflex640. The containment rings 102a and 102b were cut from sheets of the Tflex materials. Those skilled in the art will understand that the containment rings 102a and 102b could be molded, punched, or formed in a variety of other ways and a number of different materials could be used. Further, two different thermal interface materials (Laird T2500 grease and Laird thermal phase change material 5816) were used to determine the effectiveness of the containment rings 102a and 102b in preventing extrusion of low strength material (grease) and higher strength material (TPCM 5816) beyond the containment rings 102a and 102b.

Replacing the metal heat sink 70 with the glass plate and using a load cell in place of the spring connectors 72, enabled visual evaluation of the ability of the containment rings 102a and 102b to prevent extrusion of the thermal interface material 66 beyond the containment rings 102a and 102b. Further, a thickness of the thermal interface material 66 relative to the integrated circuit 58 could also be accurately determined.

FIG. 8 shows a series of optical micrographs 180a-180c of the bare circuit integrated circuit package 100 pre- and post-glass loading when using Laird T2500 grease as the thermal interface material 66. The tested bare circuit integrated circuit packages 100 were provided with a containment ring 102a constructed of Tflex 640 having a second height of 1 mm. The optical micrographs 180a-180c were taken looking through the glass plate pre-load (optical micrograph 180) and post load (optical micrographs 180b and 180c) for different loads on the glass plate. A design load target is between 7.8 Kgf and 11.8 Kgf. For the sake of illustration, a pre-load size and shape 66' of the thermal interface material 66 is shown as a dotted line in optical micrographs 180b and 180c. As illustrated in FIG. 8 the T2500 grease thermal interface material 66 does not extrude beyond the containment ring 102a at an upper limit of design load.

Similarly, FIG. 9 shows a series of optical micrographs 190a-190d for the same bare circuit integrated circuit package 100 design with the exception that T2500 grease was replaced by TPCM 5816 as the thermal interface material 66. As was the case for T2500, the TPCM 5816 thermal interface material 66 remains within the confines of the containment ring 102a with no signs of extrusion at upper limit of design load.

The combined results shown in FIGS. 8 and 9 demonstrate the ability of the example embodiments of the bare circuit integrated circuit package 100 in preventing thermal interface material 66 from extruding beyond the containment ring 102a independent of mechanical properties of the thermal interface material 66.

The glass thickness was measured prior to loading as was the height of the stiffener ring. By measuring a height difference between the stiffener ring 64 and a top of the glass plate in multiple locations across the bare circuit integrated circuit package 100, then subtracting the glass thickness from this difference, a thickness of the thermal interface material 66 could be determined. FIG. 10 shows the results of these measurements for five (5) combinations of thermal interface materials used in the bare circuit integrated circuit package 100 in a graph 250. As can be seen in the graph 250, for a containment ring 102*a* constructed of Tflex™ 640 having a second height 114 of 1.27 mm and a T2500 grease thermal interface material 66, excessive force, beyond the design target, is required to meet a thermal interface material 66 thickness design target of 25-50 μm. For a containment ring 102*a* constructed of Tflex640™ and a TPCM™ 5816 thermal interface material 66, the minimum thickness asymptotes at ~100 μm at ~1.5× the design target loads. Clearly, for the bare circuit integrated circuit package 100 a 1.27 mm thick Tflex™ 640 containment ring 102*a* does not meet the thermal interface material 66 thickness design target at the maximum design load of 11.8 Kgf.

In contrast, for a 1 mm thick Tflex™ 640 containment ring 102, both 1 step 120*b* and 2 step 102*a* designs achieve the design target thermal interface material thickness at loads within the design target.

Finally, for 1 mm thick Tflex9000 containment rings 102, excessive loads are required to meet the thermal interface material thickness design target.

The data shown in FIG. 10 and discussed above shows that the design and material selection for a confinement ring 102 design is not trivial and is a complex combination of geometry, materials properties, and loads. Thermal interface material 66 pumping related field failures have been widely observed and an object of intense work by the industry at large for 10-20 years. The current solution primarily being higher softening temperature thermal phase change materials. Although these thermal phase change materials have better stability than grease or softer materials, the thermal phase change materials have not eliminated the pumping issue. The complexity of balancing the unique geometries, materials properties, and acceptable loads for each application and device design is what has prevented the industry from addressing the pumping issue. The presently disclosed inventive concepts address the complexity of balancing the critical controlling materials and geometries and provides a robust solution to thermal interface material pumping.

Figure 11:
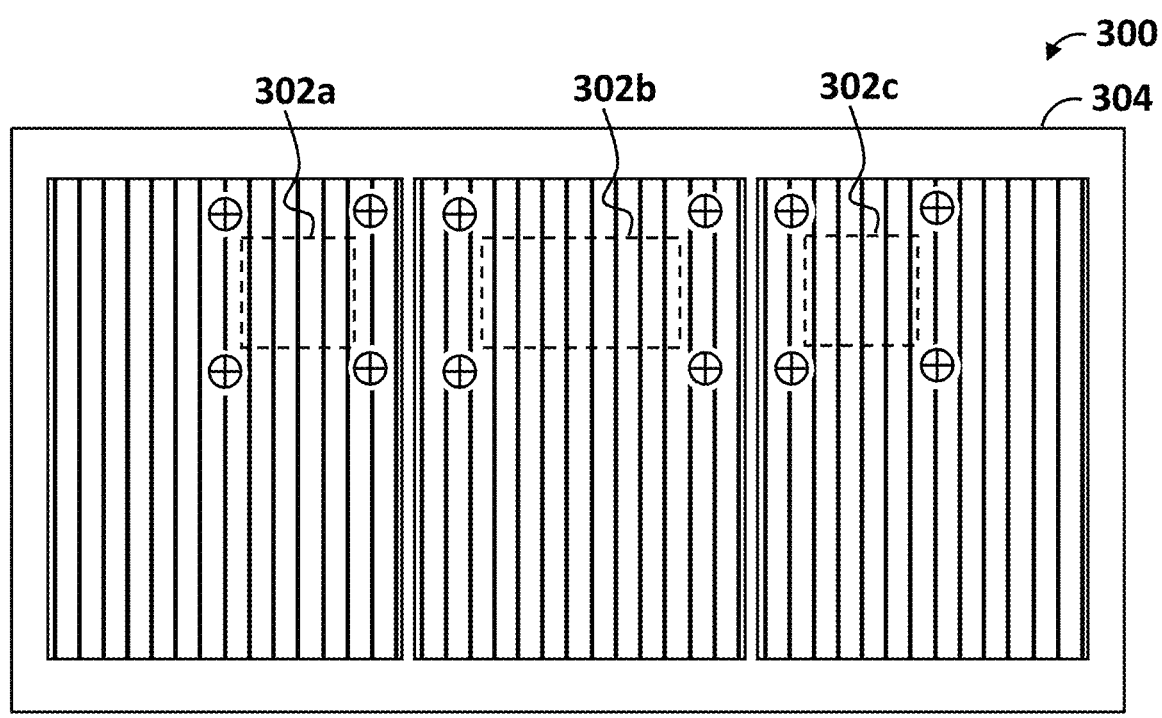
FIG. 11 is schematic representation of a test system having three bare circuit integrated circuit packages soldered to a printed circuit board with heat sinks installed.
Figure 12:
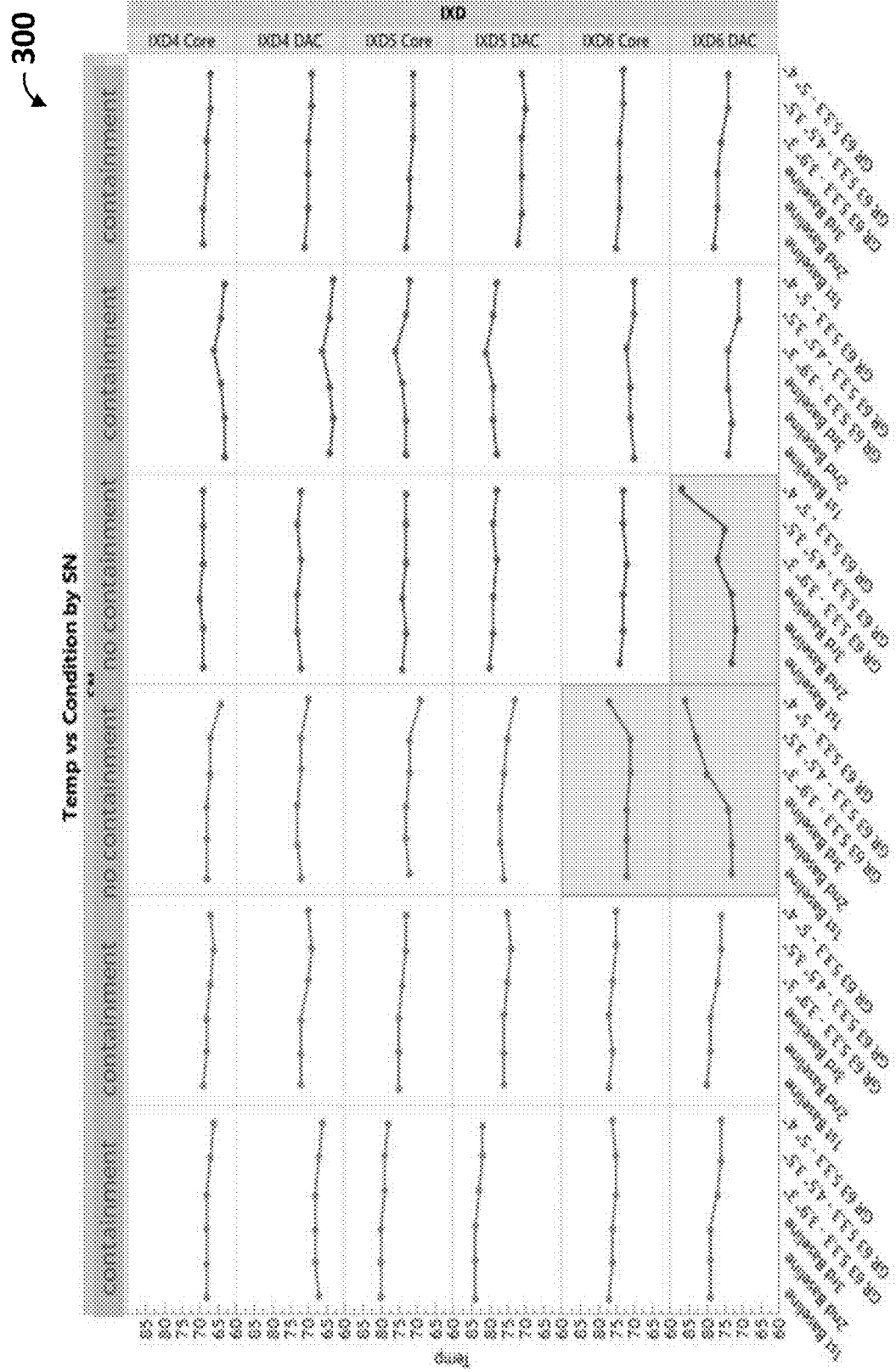
FIG. 12 is a table having graphical representations of results of drop testing performed on six different test systems of FIG. 10, four of which had containment rings and two of which did not have containment rings.
Figure 13:
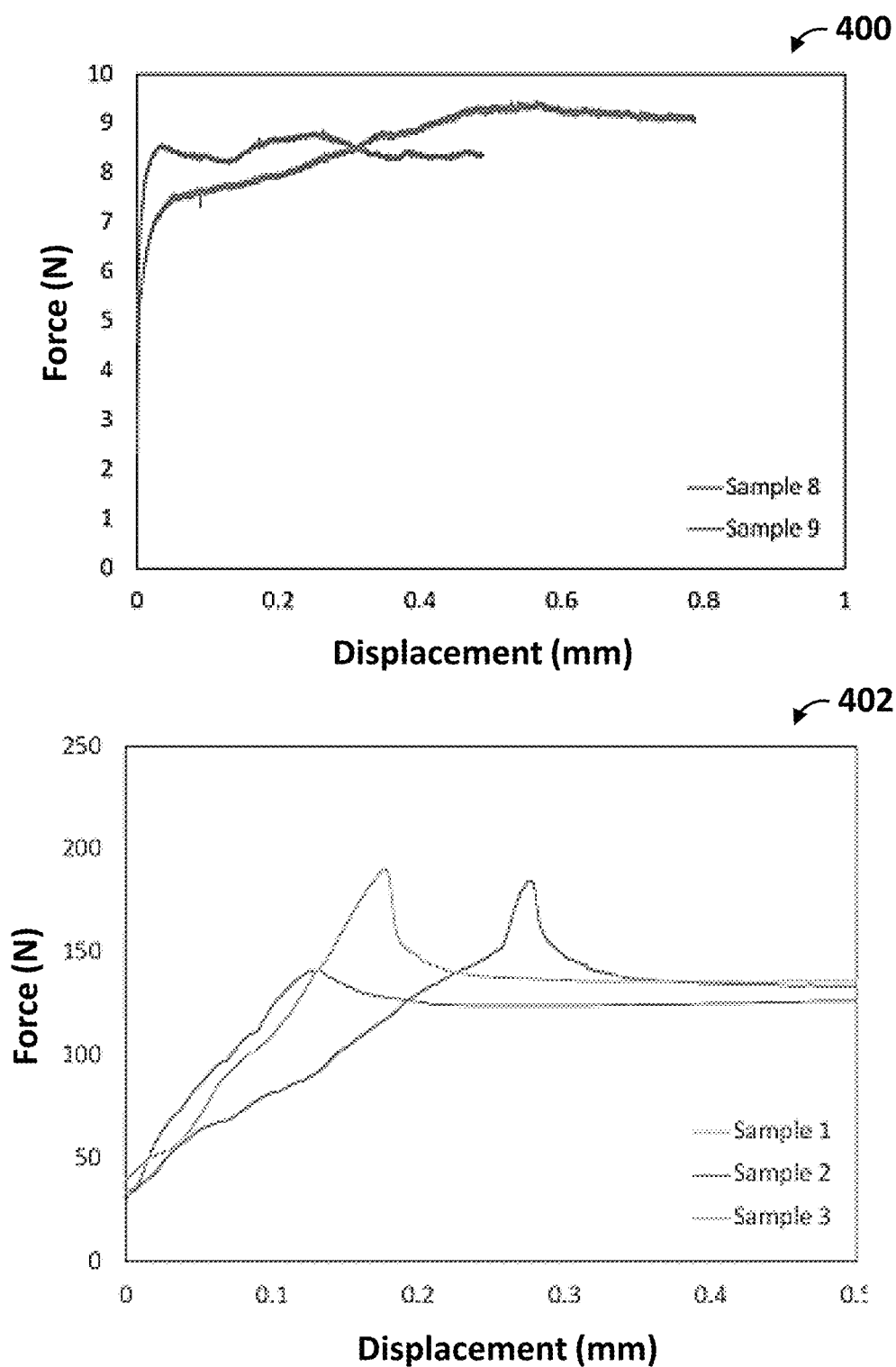
FIG. 13 is a graphical representation of measurements of tensile load versus displacement of a heat sink relative to an integrated circuit in bare circuit integrated circuit packages without a containment ring compared to bare circuit integrated circuit packages having containment rings.

Referring not to FIGS. 11-13, a test system 300 was constructed with three bare circuit integrated circuit packages 302*a*, 302*b*, and 302*c* installed on a PCB 304. The bare circuit integrated circuit packages 302*a*, 302*b*, and 302*c* were assembled with containment rings 102*b* (such as bare circuit integrated circuit package 150) and without containment rings (such as bare circuit integrated circuit package 50). For testing, the containment rings 102*b* of the bare circuit integrated circuit packages 150 were made using interface pad material manufactured by Laird and sold under the name Tflex™ 640. The containment rings 102*b* were 1 mm thick, the gap 154 between the integrated circuit 58 and the containment ring 102*b* was set at 10+/−5% of the displaced volume of the thermal interface material 66. The substrate 56 size was 42.5 mm×42.5 mm. The stiffener ring 64 was made of copper and was 0.8 mm tall and 5 mm wide. The integrated circuit 58 was 18.5 mm×24 mm and its height was 0.9 mm above the substrate. The bare circuit integrated circuit packages 302*a*, 302*b*, and 302*c* were soldered to the PCB 304 via BGA reflow after which heat sinks 70*a*, 70*b*, and 70*c* with fins were assembled with 4 screws per heat sink. Total load per heat sink 70 was between 7.8 Kgf and 11.8 Kgf. A 42.5 mm×42.5 mm Ni coated Cu part of the heat sink 70 was connected to the integrated circuit 58 through thermal interface material 66. For testing, the thermal interface material 66 was a thermal phase change material manufactured and sold by Laird under the name TPCM™ 5816. The integrated circuit 58 in each package had two temperature sensors (not shown) integrated into the circuitry, one near the edge of the integrated circuit 58 and another near the center. These sensors were used to determine the "quality" of the thermal interface material 66 interface pre- and post-shock. The integrated circuit 58 power was ~140 W.

After the test systems 300 were assembled, the bare circuit integrated circuit packages 302*a*, 302*b*, and 302*c* devices were powered up to ~140 W and the thermal behavior of each integrated circuit 58 on each bare circuit integrated circuit packages 302*a*, 302*b*, and 302*c* was characterized via the two temperature sensors. Subsequently, the test systems 300 were exposed to drop testing on concrete floor from 3.9, 4.5, and 5 inches. The industry standard qualification shock test for such board designs is a 3.9 inch drop. To test the robustness and limits of the presently disclosed inventive concepts, the shock test drop height was increased to 5 inches. The approximate shock levels and duration were 11 Gs, 11 ms; 12.75 G's, 11 ms; and 14.1 gs, 11 ms.

Table 300 of FIG. 12 summarizes the results of this testing. The four test systems 300 with the bare circuit integrated circuit packages 302*a*, 302*b*, and 302*c* that were assembled with containment rings 102*b* were stable throughout all shock testing as measured by the temperature stability (failure is >4° C.). In contrast, two of the three bare circuit integrated circuit packages 302*a*, 302*b*, and 302*c* on the two test systems 300 built with no containment rings failed after 3.9-inch and 4.5-inch drops, respectively. Visual and microscopic characterization of the failed bare circuit integrated circuit packages showed the failure was in fact due to pumping of the thermal interface material from the integrated circuit to heat sink joint and thus increasing the ΔT across the joint. Whereas similar characterization of the bare circuit integrated circuit packages 302*a*, 302*b*, and 302*c* having containment rings showed no such degradation. This data proves that the containment ring design, when appropriately implemented with the appropriate materials and design, improve the shock resistance to thermal degradation of bare circuit integrated circuit packages 302*a*, 302*b*, and 302*c* on test systems 300 with spring loaded heat sinks 70*a*, 70*b*, and 70*c*.

The shock level was increased for the bare circuit integrated circuit packages 302*a*, 302*b*, and 302*c* having containment rings by dropping from 6 inches. Unfortunately, it was not possible to determine the robustness of the bare circuit integrated circuit packages 302*a*, 302*b*, and 302*c* with containment rings with respect to its thermal performance after exposed to 6 inch drop-shock testing because catastrophic failure of other joint of many bare circuit integrated circuit packages 302*a*, 302*b*, and 302*c* on the PCB 304 during the shock test occurred. For instance, connection of the heat sinks to the PCB 304 failed. The mass failure of other joints prevented characterization of the thermal characteristics of the thermal interface material bare circuit integrated circuit packages 302*a*, 302*b*, and 302*c* having containment rings after 6 inch drop. However, visual inspection of the thermal interface material in the joints between the integrated circuits and heat sinks in the thermal interface material bare circuit integrated circuit packages 302*a*, 302*b*, and 302*c* having containment rings post 6 inch drop indicated that the thermal interface material in the joints between the integrated circuits and heat sinks were stable and unaffected by the 6 inch shock test. These results indicate that not only did the containment rings of the presently disclosed inventive concepts prevent thermal interface material joint failure from occurring when exposed to the industry standard 3.9" drop test, but also prevented joint failure from occurring at >1.5× the standard drop height. Even more surprising was the fact that other devices on the test system 300 that were stable up to 5 inch drop had catastrophic failure when exposed to 6 inch drop, but the thermal interface material in the joint between the integrated circuits and heat sinks in bare circuit integrated circuit packages 302a, 302b, and 302c having containment rings did not fail.

Finally, mechanical strength of bare circuit integrated circuit packages 302a, 302b, and 302c with and without containment rings was characterized to determine how the containment rings impacted the overall strength of the joint between the bare circuit integrated circuit packages 302a, 302b, and 302c and the heat sinks. Graphs 400 and 402 of FIG. 13 show a comparison of a tensile load versus displacement of the heat sinks 70a, 70b, and 70c with respect to the integrated circuit 58 for 302a, 302b, and 302c with containment rings (graph 402) and without containment rings (graph 400). As shown in graph 402, the devices assembled with containment rings have a substantially higher load to joint failure than those with no containment rings as shown in graph 400.

These results help to explain the unexpected improvement in robustness the addition of the containment rings 102 of the presently disclosed inventive concepts provides. Not only does the containment ring 102 provide restoring forces and prevention of severing of the thermal interface material, but the containment ring 102 also provides improvements in strength and in strain to failure of the joint between the heat sink and the integrated circuit. This combination is responsible for the massive improvement in the overall robustness of the bare circuit integrated circuit packages 302a, 302b, and 302c having containment rings.

CONCLUSION

Conventionally, bare circuit integrated circuit packages were susceptible to thermal degradation due to pumping and/or displacement of the thermal interface material. In accordance with the present disclosure, a containment ring is placed in a space between a stiffener ring and an integrated circuit in the bare circuit integrated circuit package that resists displacement of the thermal interface material and/or pushes the thermal interface material back into place.

The foregoing description provides illustration and description, but is not intended to be exhaustive or to limit the inventive concepts to the precise form disclosed. Modifications and variations are possible in light of the above teachings or may be acquired from practice of the methodologies set forth in the present disclosure.

Even though particular combinations of features are recited in the claims and/or disclosed in the specification, these combinations are not intended to limit the disclosure. In fact, many of these features may be combined in ways not specifically recited in the claims and/or disclosed in the specification. Although each dependent claim listed below may directly depend on only one other claim, the disclosure includes each dependent claim in combination with every other claim in the claim set.

No element, act, or instruction used in the present application should be construed as critical or essential to the invention unless explicitly described as such outside of the preferred embodiment. Further, the phrase "based on" is intended to mean "based, at least in part, on" unless explicitly stated otherwise.

What is claimed is:

1. A bare circuit integrated circuit package, comprising:
a substrate connected to a printed circuit board;
an integrated circuit connected to the substrate, the integrated circuit having a top;
a stiffener ring attached to the substrate, the stiffener ring surrounding the integrated circuit;
a heat sink having a bottom surface that is positioned on the stiffener ring and over the integrated circuit such that there is a space between the top of the integrated circuit and the bottom surface of the heat sink, the heat sink connected to the printed circuit board;
a thermal interface material, the thermal interface material having an uncompressed volume and a compressed volume, the compressed volume being a volume of the thermal interface material compressed in the space between the top of the integrated circuit and the bottom surface of the heat sink to thermally connect the integrated circuit and the heat sink; and
a containment ring having a first wall and a second wall positioned between the stiffener ring and the integrated circuit, the containment ring sized and positioned such that a gap between the first wall of the containment ring and the integrated circuit has a volume of air of between zero percent and thirty percent smaller than the compressed volume of the thermal interface material.

2. The bare circuit integrated circuit package of claim 1, wherein the containment ring has a height that is between 0.05 mm and 1 mm higher than a height of the integrated circuit when connected to the substrate plus the space between the top of the integrated circuit and the bottom of the heat sink.

3. The bare circuit integrated circuit package of claim 1, wherein the containment ring is a stepped containment ring having a first step and a second step.

4. The bare circuit integrated circuit package of claim 3, wherein the first step of the stepped containment ring has a first height substantially equal to a height of the integrated circuit when connected to the substrate and the second step having a second height that is between 0.05 mm and 1 mm higher than a height of the integrated circuit when connected to the substrate plus the space between the top of the integrated circuit and the bottom of the heat sink.

5. The bare circuit integrated circuit package of claim 1, wherein when the heat sink is connected to the printed circuit board a force exerted on the stiffener ring is between 7.8 Kgf and 11.8 Kgf.

6. The bare circuit integrated circuit package of claim 5, wherein the space between the top of the integrated circuit and the bottom surface of the heat sink is between 25 μm and 50 μm when the heat sink is connected to the printed circuit board such that the force exerted on the stiffener ring is between 7.8 Kgf and 11.8 Kgf.

7. The bare circuit integrated circuit package of claim 1, wherein the thermal interface material is a thermal phase change material.

8. The bare circuit integrated circuit package of claim 1, wherein the thermal interface material is a thermal grease.

9. The bare circuit integrated circuit package of claim 1, wherein the containment ring is constructed of a compressible and deformable material.

10. The bare circuit integrated circuit package of claim 1, wherein the substrate is a multi-layer ball grid array substrate.

11. A method of assembling a bare circuit integrated circuit package, comprising:
connecting an integrated circuit to a substrate;
connecting a stiffener ring to the substrate surrounding the integrated circuit;
positioning a containment ring having a first wall and a second wall between the stiffener ring and the integrated circuit, the containment ring sized and positioned such that a gap between the first wall of the containment ring and the integrated circuit has a volume of air of between zero percent and thirty percent of a compressed volume of thermal interface material;
applying the thermal interface material to a top surface of the integrated circuit, the thermal interface material having an uncompressed volume and a compressed volume, the compressed volume being a volume of the thermal interface material compressed in a space; and
applying a heat sink to compress the thermal interface material and to cover the integrated circuit and the containment ring, the heat sink having a bottom surface that is positioned on the stiffener ring and over the integrated circuit.

12. The method of assembling the bare circuit integrated circuit package of claim 11, wherein the containment ring has a height that is between 0.05 mm and 1 mm higher than a height of the integrated circuit when connected to the substrate plus the space between the top of the integrated circuit and the bottom of the heat sink.

13. The method of assembling the bare circuit integrated circuit package of claim 11, wherein the containment ring is a stepped containment ring having a first step and a second step, and wherein the step of positioning the containment ring includes positioning the first step adjacent to an outer peripheral edge of the integrated circuit.

14. The method of assembling a bare circuit integrated circuit package of claim 13, wherein the first step of the stepped containment ring has a first height substantially equal to a height of the integrated circuit when connected to the substrate and the second step having a second height that is between 0.05 mm and 1 mm higher than a height of the integrated circuit when connected to the substrate plus the space between the top of the integrated circuit and the bottom of the heat sink.

15. The method of assembling a bare circuit integrated circuit package of claim 11, wherein applying the heat sink is defined further as exerting a force on the stiffener ring between 7.8 Kgf and 11.8 Kgf.

16. The method of assembling a bare circuit integrated circuit package of claim 15, wherein the applying the heat sink forms a space between the top of the integrated circuit and the bottom surface of the heat sink between 25 μm and 50 μm.

17. The method of assembling a bare circuit integrated circuit package of claim 11, wherein applying the thermal interface material is defined further as applying the thermal interface material in a solid form, the thermal interface material being a thermal phase change material.

18. The method of assembling a bare circuit integrated circuit package of claim 11, wherein applying the thermal interface material is defined further as applying the thermal interface material in a liquid form, the thermal interface material being a thermal grease.

19. The bare circuit integrated circuit package of claim 1, wherein the integrated circuit includes silicon.

\* \* \* \* \*